(12) United States Patent
Schelling et al.

(10) Patent No.: US 9,416,000 B2
(45) Date of Patent: Aug. 16, 2016

(54) COMPONENT INCLUDING TWO SEMICONDUCTOR ELEMENTS, BETWEEN WHICH AT LEAST TWO HERMETICALLY SEALED CAVITIES ARE FORMED AND METHOD FOR ESTABLISHING A CORRESPONDING BONDING CONNECTION BETWEEN TWO SEMICONDUCTOR ELEMENTS

(71) Applicant: Robert Bosch GmbH, Stuttgart (DE)

(72) Inventors: Christoph Schelling, Stuttgart (DE); Ralf Reichenbach, Esslingen (DE); Jens Frey, Filderstadt (DE); Antoine Puygranier, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/731,666

(22) Filed: Jun. 5, 2015

(65) Prior Publication Data
US 2015/0353347 A1 Dec. 10, 2015

(30) Foreign Application Priority Data
Jun. 6, 2014 (DE) .......................... 10 2014 210 862

(51) Int. Cl.
*B81B 7/00* (2006.01)
*B81C 1/00* (2006.01)

(52) U.S. Cl.
CPC ............ *B81B 7/0041* (2013.01); *B81C 1/00293* (2013.01); *B81B 2203/0315* (2013.01); *B81C 1/00285* (2013.01); *B81C 2203/0118* (2013.01); *B81C 2203/0145* (2013.01)

(58) Field of Classification Search
CPC ................... B81C 1/00293; B81C 2203/0118; B81C 2203/0145; B81B 2203/0315; B81B 7/0041
See application file for complete search history.

(56) References Cited

U.S. PATENT DOCUMENTS

2012/0326248 A1    12/2012   Daneman et al.

*Primary Examiner* — Ermias Woldegeorgis
*Assistant Examiner* — John Bodnar
(74) *Attorney, Agent, or Firm* — Norton Rose Fulbright US LLP

(57) ABSTRACT

To implement cavities having different internal pressures in joining two semiconductor elements, at least one of the two element surfaces to be joined is structured, so that at least one circumferential bonding frame area is recessed or elevated in comparison with at least one other circumferential bonding frame area. At least one connecting layer should then be applied to this structured element surface and at least two circumferential bonding frames should be structured out of this connecting layer on different surface levels of the element surface. The topography created in the element surface permits sequential bonding in which multiple cavities between the two elements may be successively hermetically sealed, so that a defined internal pressure prevails in each of the cavities.

4 Claims, 3 Drawing Sheets

COMPONENT INCLUDING TWO SEMICONDUCTOR ELEMENTS, BETWEEN WHICH AT LEAST TWO HERMETICALLY SEALED CAVITIES ARE FORMED AND METHOD FOR ESTABLISHING A CORRESPONDING BONDING CONNECTION BETWEEN TWO SEMICONDUCTOR ELEMENTS

RELATED APPLICATION INFORMATION

The present application claims priority to and the benefit of German patent application no. 10 2014 210 862.4, which was filed in Germany on Jun. 6, 2014, the disclosure of which is incorporated herein by reference.

FIELD OF THE INVENTION

The present invention relates to a component including at least two semiconductor elements, which are interconnected via at least one structured connecting layer, at least two cavities being formed between these two elements, each cavity being hermetically sealed by a circumferential bonding frame in the connecting layer, so that a defined internal pressure prevails in each cavity. In addition, the present invention relates to a method for establishing a bonding connection between two semiconductor elements.

BACKGROUND INFORMATION

An important example of application of the components in question here are so-called IMUs (inertial measurement units) including a MEMS element, which includes both a rotation rate sensor component and an acceleration sensor component. The two sensor components are implemented in the layer structure of the MEMS element and are situated side by side. They are capped with the aid of the second element in order to protect the sensor structures and to ensure defined pressure conditions for the particular sensor operation. Since rotation rate sensors and acceleration sensors are usually operated at different ambient pressures, a separate cap structure is provided for each sensor structure in the second element. In the case of rotation rate sensors, one part of the sensor structure is driven resonantly. A low internal pressure of approximately 1 mbar may be therefore set in the cavity of a rotation rate sensor element in order to keep damping of the sensor structure low. The rotation rate sensor may then be operated even at a relatively low excitation voltage. In contrast thereto, the sensor structure of an acceleration sensor should not be excited to vibrations. Acceleration sensors are therefore operated at a significantly higher internal pressure of typically 500 mbar.

Patent document US 2012/0326248 A1 relates to the implementation of such different pressure conditions for the individual sensor components of a MEMS element which are capped with the aid of a shared cap element. This publication suggests, among other things, that the bonding process used to bond the MEMS element and the cap element shall be carried out in multiple stages, so that the cavities of the individual sensor components are not sealed simultaneously but instead are sealed in successive bonding steps. This procedure makes use of the fact that the external pressure conditions during a bonding process may vary greatly. It is therefore possible to predefine different pressure conditions during the successive bonding steps and to select them in accordance with the sought internal pressure of those cavities, which are sealed in the particular process step.

According to patent document US 2012/0326248 A1, the pressure-tight connection between the MEMS element and the cap element is established via two layers of material, which are applied to the two element surfaces to be joined and out of which bonding frames for the individual cavities are structured. To achieve a multistep bonding process, the bonding frames for the individual cavities are created with different layer thicknesses on at least one of the two element surfaces.

During the bonding process, the MEMS element and the cap element are pressed against one another with the surfaces thereby prepared. The thickest, most exposed bonding frames then come into contact initially and, in a first bonding step, form a hermetically sealed bonding connection by which a first cavity is sealed. The elements are then pressed together until the thinner bonding frames also come into contact. Only then is an additional cavity sealed by the resulting hermetically sealed bonding connection of the thinner bonding frames. Since this second bonding step is carried out at a different ambient pressure than the first bonding step, different internal pressures are established in the two cavities.

The manufacture of bonding frame structures having different layer thicknesses has proven to be relatively complex in practice and is not suitable for all bonding materials.

SUMMARY OF THE INVENTION

This concept of sequential bonding for implementing cavities having different internal pressures in bonding two elements, which is from US 2012/0326248 A1, has been refined with the present invention.

In contrast thereto, according to the component concept according to the present invention, at least two of the circumferential bonding frames are to be situated on different surface levels of at least one of the two elements.

According to the claimed method for establishing a bonding connection between two semiconductor elements, at least one of the two element surfaces to be joined is structured so that at least one circumferential bonding frame area is recessed or elevated in comparison with at least one other circumferential bonding frame area. At least one connecting layer is then applied to this structured element surface, at least two circumferential bonding frames being formed on different surface levels of the element surface in this connecting layer.

According to the present invention, the structuring of the element surface in the bonding frame area may advantageously take place together with the exposure of the MEMS structure—in the case of the MEMS element—or with the formation of the cap structures in the case of the cap element. This does not require a separate process step. The bonding frames may then simply be structured out of a uniformly thick layer of material in one process step since the topography of the bonding surface required for sequential bonding is already implemented in the structured element surface.

There are fundamentally various options for the implementation of different surface levels for the circumferential bonding frames with which the cavities between the two elements are to be sealed.

One of the two element surfaces to be joined is advantageously structured in the bonding frame area, while the other is not structured at least in this area. However, variants in which the two element surfaces to be joined are structured in the bonding frame area are also conceivable.

Within the scope of this structuring, circumferential trench-type recesses may be created, but also circumferential pedestal-type elevations are created, depending on whether the structuring takes place due to removal of material, for example, in an etching process, or due to application of material, for example, by deposition of additional layers of material. The only important thing is that at least two different surface levels are created for the circumferential bonding frames, so that at least one bonding frame is recessed or elevated with respect to at least one other bonding frame.

As already explained above, there are various possibilities for advantageously developing and refining the present invention. Reference is therefore made to the patent claims which are subordinate to the independent patent claims, on the one hand, and to the following description of an exemplary embodiment of the present invention with reference to the figures, on the other hand.

DETAILED DESCRIPTION

Figure 1A:
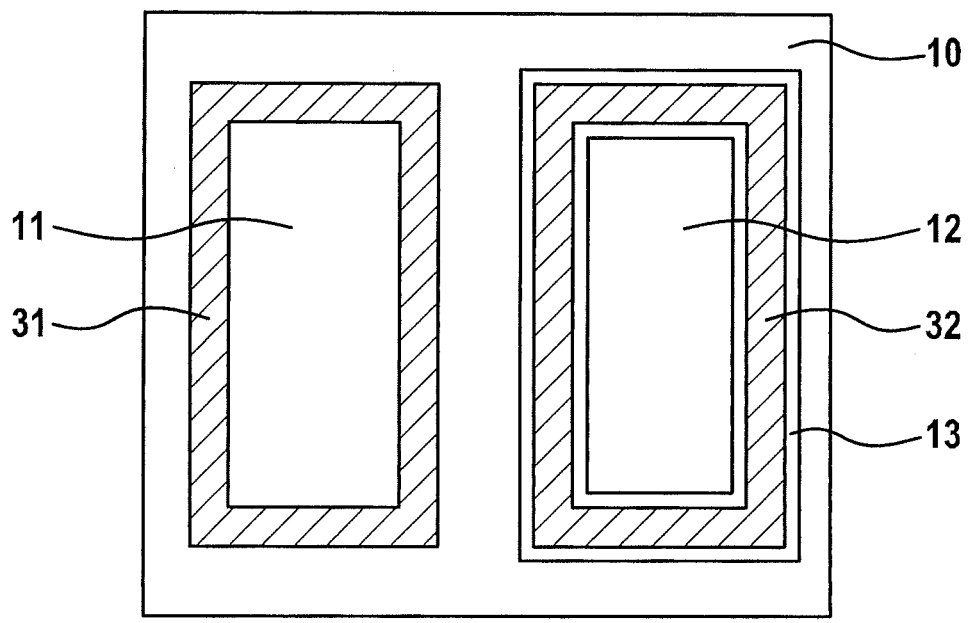
FIG. 1a shows a top view of the surface of MEMS element 10 structured according to the present invention after application and structuring of a first connecting layer.

MEMS element 10, shown in FIGS. 1a, includes two different MEMS functions, which are implemented as structural components in chip areas 11 and 12. This may be, for example, a sensor structure for detecting rotation rates and a sensor structure for detecting accelerations. A detailed description has been omitted here since the specific embodiment of both structural components 11 and 12 is irrelevant for the present invention in question here. At any rate, both structural components 11 and 12 should be hermetically sealed in their own cavities, so that each structural component 11 and 12 is operated at the suitable ambient pressure. Different internal pressures must therefore prevail in the two cavities.

Figure 1B:
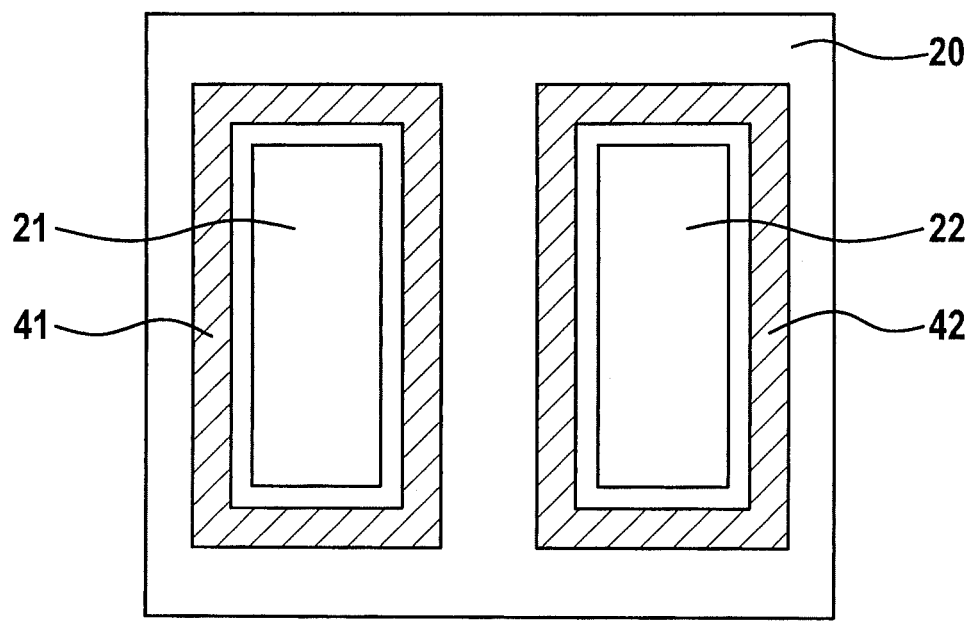
FIG. 1b shows a top view of the surface of a cap element 20 for MEMS element 10 after application and structuring of a second connecting layer.

Structural components 11 and 12 of MEMS element 10 are capped with the aid of cap element 20, in whose surface, shown in FIG. 1b, two cap recesses 21 and 22 which are independent of each other are formed for structural components 11 and 12.

Figure 2A:
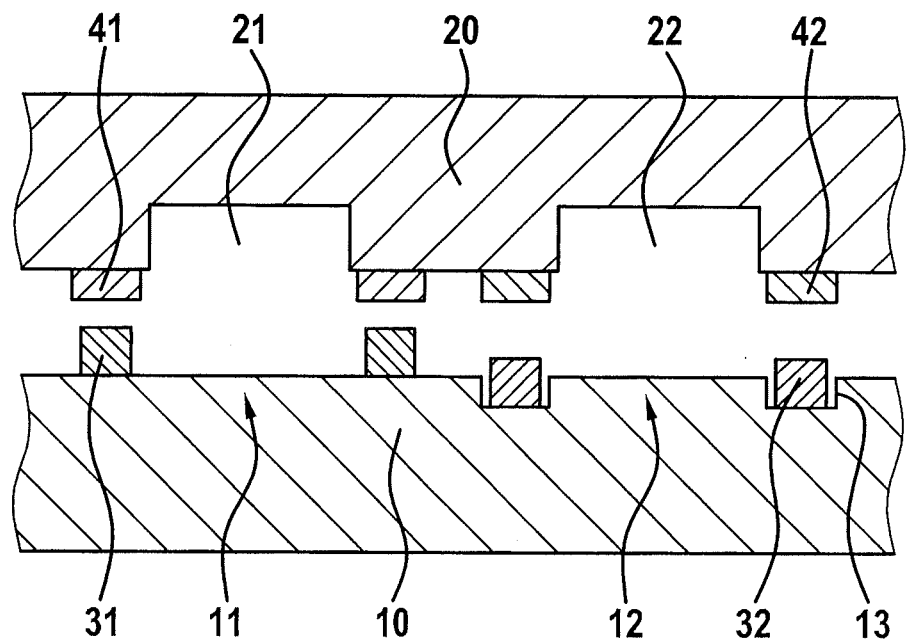
FIGS. 2a, 2b and 2c illustrate the bonding concept according to the present invention on the basis of schematic sectional diagrams of MEMS element 10 and cap element 20 before the first bonding step (FIG. 2a), after the first bonding step, before the second bonding step (FIG. 2b) and after the second bonding step (FIG. 2c).
Figure 2B:
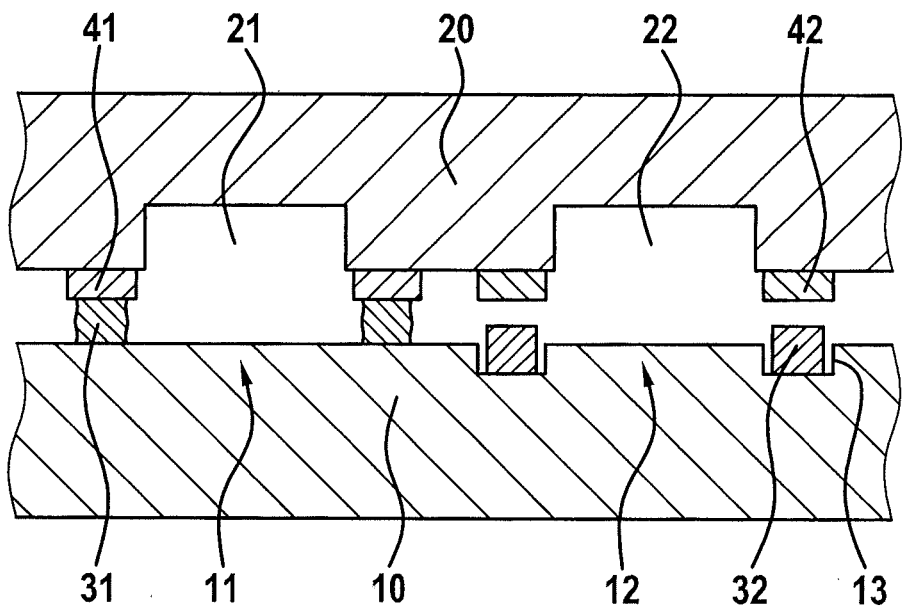
Figure 2C:
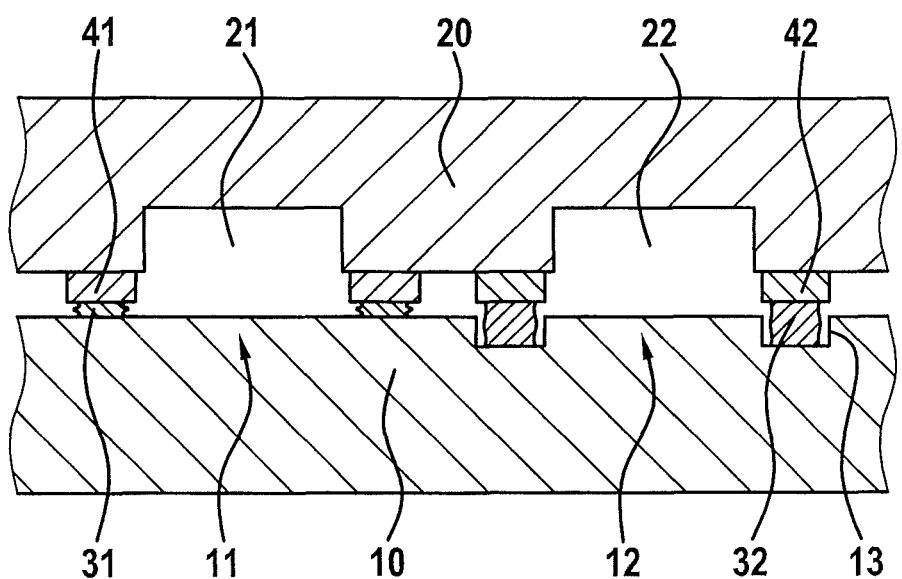

The connection between the surface of MEMS element 10, shown in FIGS. 1a, and the surface of cap element 20, shown in FIGS. 1b, should be established according to the present invention in a sequential bonding process, which is explained in conjunction with FIGS. 2a through 2c. A trench-type recess 13 was therefore created in the surface of MEMS element 10, which surrounds structural component 12 in the form of a closed ring. The surface structured in this way was then provided with a first bonding material layer, out of which a bonding frame 31 for structural component 11 and a bonding frame 32 for structural component 12 were structured. Since bonding frame 31 is situated on the closed element surface, and bonding frame 32 is situated in a recess 13, the two bonding frames 31 and 32, which are closed at the circumference, are on different surface levels of MEMS element 10.

In the exemplary embodiment shown here, the surface of cap element 20 was also provided with bonding frames 41 and 42 made of a second bonding material. These bonding frames 41 and 42 are also in the form of a closed ring and surround cap recesses 21 and 22. Since cap element 20 is not structured in these areas, the two bonding frames 41 and 42 are on the same surface level of cap element 20.

FIG. 2a shows how elements 10 and 20 prepared in this way are adjusted to one another for the bonding process. Furthermore, FIG. 2a illustrates that bonding frames 31 and 32 are formed from a uniformly thick layer of material, and bonding frame 32 is situated in recess 13 in the element surface, while bonding frame 31 is situated on the closed element surface, so that it protrudes beyond bonding frame 32. Bonding frames 41 and 42 also have the same layer thickness and both are situated on the closed surface of the cap element.

A desired atmosphere, i.e., a certain gas and a defined pressure, is now set in the process chamber of the bonding device before the two elements 10 and 20 are moved toward one another and bonding frames 31 and 41 are brought into contact, as shown in FIG. 2b. Depending on the bonding method and the bonding materials, the required process temperature is now set and the required contact pressure is applied to create a bonding connection to the materials of bonding frames 31 and 41 and to enclose structural component 11 in cavity 21 by a hermetically tight seal. An internal pressure, which corresponds to the pressure conditions in the process chamber of the bonding device, is enclosed in cavity 21. FIG. 2b illustrates that cavity 22 of structural component 12 is not yet sealed after this first bonding step.

The atmosphere in the process chamber of the bonding device is set according to the desired gas and pressure conditions in cavity 22 before the second bonding step. The two elements 10 and 20 are then pressed together further until bonding frames 32 and 42 also come into contact. The bonding connection is also established here by applying the required contact pressure at a predefined process temperature, as illustrated in FIG. 2c.

In conclusion, it should also be pointed out that the bonding concept according to the present invention may be used for eutectic bonding as well as for thermal compression bonding or SLID bonding. Al—Ge, Au—Si, Au—Au, Cu—Cu, Au—AlSiCu and Cu—Sn—Cu may be used as bonding materials. However, other material systems may also be considered in principle, such as glass frit, for example.

What is claimed is:

1. A component, comprising:
   at least two semiconductor elements, which are interconnected via at least one structured connecting layer, at least two cavities being formed between the two elements, each cavity being hermetically sealed by a circumferential bonding frame in the connecting layer so that a defined internal pressure prevails in each of the cavities;
   wherein at least two of the circumferential bonding frames are situated on different surface levels of at least one of the two elements.

2. The component of claim 1, wherein the surface of at least one of the two elements is structured, so that at least one circumferential bonding frame is situated recessed or elevated with respect to at least one other circumferential bonding frame.

3. The component of claim 2, wherein the surface of the other element is not structured, at least in the area of the circumferential bonding frame.

4. The component of claim 1, wherein at least two different internal pressures prevail in the cavities.

\* \* \* \* \*